(12) United States Patent
Chen

(10) Patent No.: US 7,973,548 B2
(45) Date of Patent: Jul. 5, 2011

(54) SEMICONDUCTOR TEST EQUIPMENT WITH CONCENTRIC POGO TOWERS

(75) Inventor: Fong Jay Chen, Hsinchu (TW)

(73) Assignee: King Yuan Electronics Co., Ltd. (TW)

( * ) Notice: Subject to any disclaimer, the term of this patent is extended or adjusted under 35 U.S.C. 154(b) by 0 days.

(21) Appl. No.: 12/591,136

(22) Filed: Nov. 10, 2009

(65) Prior Publication Data

US 2011/0018568 A1  Jan. 27, 2011

(30) Foreign Application Priority Data

Jul. 22, 2009 (TW) .............................. 98124694 A

(51) Int. Cl.
*G01R 31/02* (2006.01)

(52) U.S. Cl. ................................................. 324/755.01
(58) Field of Classification Search .................. None
See application file for complete search history.

(56) References Cited

U.S. PATENT DOCUMENTS

| | | | | |
|---|---|---|---|---|
| 6,348,810 | B1* | 2/2002 | Yanagawa et al. | 324/754.03 |
| 7,701,233 | B2* | 4/2010 | Pi-Hui | 324/754.07 |
| 7,847,571 | B2* | 12/2010 | Chang | 324/755.05 |
| 2010/0201392 | A1* | 8/2010 | Chang | 324/761 |
| 2010/0204949 | A1* | 8/2010 | Chang | 324/537 |

* cited by examiner

*Primary Examiner* — Jermele M Hollington
(74) *Attorney, Agent, or Firm* — Bacon & Thomas, PLLC

(57) ABSTRACT

A semiconductor test equipment with concentric pogo towers is disclosed, which comprises a base, a tester head, an outer pogo tower, and an inner pogo tower. The inner pogo tower is concentrically received in the outer pogo tower, and a connecting slot of the inner pogo tower is correspondingly engaged with a connecting pin of the outer pogo tower. The outer pogo tower is fixed to the load board together with the inner pogo tower, whereby a plurality of outer pogo pins of the outer pogo tower and a plurality of inner pogo pins of the inner pogo tower are electrically connected to the load board respectively. Therefore, the present invention is capable of expanding the test specifications, but also to change rapidly from different test specifications through replacing a different probe card but without to modify any other hardware.

9 Claims, 5 Drawing Sheets

SEMICONDUCTOR TEST EQUIPMENT WITH CONCENTRIC POGO TOWERS

BACKGROUND OF THE INVENTION

1. Field of the Invention

The present invention relates to a semiconductor test equipment with concentric pogo towers, and more particularly, to a semiconductor test equipment with expandable pogo tower.

2. Description of Related Art

In terms of the current technology, the specifications of semiconductor test equipments almost cannot be changed. For instance, the conventional specifications of common semiconductor test equipment have 256 input/output channels and 16 groups DPS. However, due to the development of the functional integration are higher and higher in electronic products, the signal types are getting more complex related thereof.

However, improving the testing capacity in order to satisfy the current industrial requirements, the testing capabilities have been improved continuously. Hence, the specifications have been gradually upgraded from the 256 input/output channels and 16 groups DPS to the 512 input/output channels and 32 groups DPS. For this purpose, the outdated equipment with the 256 input/output channels and 16 groups DPS is difficult to further expand its test specifications due to limitations of original software or hardware, expect for re-purchasing new equipment with the 512 input/output channels and 32 groups DPS.

Although the re-equipped equipments are existed in order to expand the test specifications, it takes considerable costs of re-equipping and would not be compatible with the original test specifications after re-equipped. Therefore, it is desirable to provide an equipment that can be both compatible with the old and the new test specifications, which improves the problems as aforementioned for the equipment used in testing the shortcomings of a single specification, and may easy to expand the equipments according to the actual requirements.

SUMMARY OF THE INVENTION

An object of the present invention is to provide a semiconductor test equipment with concentric pogo towers, comprising a base, a tester head, an outer pogo tower, and an inner pogo tower. The base includes a stage thereon, and a recessed card holder provided on the stage. The tester head is removeably provided on the stage of the base, the tester head includes a load board therebelow the tester head. In addition, the outer pogo tower includes an inner annular surface, a first connecting component and a plurality of outer pogo pins. Also, the inner pogo tower is concentrically received in the outer pogo tower and surrounding with the inner annular surface of the outer pogo tower. The inner pogo tower includes an outer peripheral surface, a second connecting component and a plurality of inner pogo pins.

According to the present invention, the inner pogo tower integrates with the outer pogo tower through the second connecting component correspondingly engaging with the first connecting component. Moreover, the outer pogo tower is fixed to the load board of the tester head together with the inner pogo tower corresponding to the recessed card holder of the base. In which, the plurality of inner pogo pins and the plurality of outer pogo pins are electrically connected to the load board respectively. Therefore, the present invention due to the integration of the inner pogo tower and the outer pogo tower, which through the second connecting component correspondingly engaging with the first connecting component, it is capable of expanding the test specifications.

Preferably, the first connecting component of the outer pogo tower is detachably engaged with the second connecting component of the inner pogo tower, so that the present invention can easily to disassemble, expand, or maintain based on the process requirements. Alternatively, the outer pogo tower may undetachably engage to the inner pogo tower. Furthermore, the second connecting component includes at least one connecting slot recessed on the outer peripheral surface. The at least one connecting slot may comprises an opened end and a closed end, wherein the opened end is configured faraway from the load board rather than the closed end.

In addition, the first connecting component of the outer pogo tower may include at least one connecting pin radially protruded from the inner annular surface of the outer pogo tower. The at least one connecting pin correspondingly sliding into the opened end of the at least one connecting slot and stopped at the closed end for engagement. Hence, the at least one connecting slot of the second connecting component of the inner pogo tower lodges in the at least one connecting pin of the first connecting component to be received in the outer pogo tower, in order to disassemble and assemble easily. Besides, as well as the aforementioned first and second connecting component can be exchanged, or utilize the way of embedding, lodging, fastening, locking, or other equivalents.

Further, the at least one connecting slot of the inner pogo tower may comprises two or more axially extended slots, L-shaped slot, spiral slot, or any other form of slot. In addition, the at least one connecting pin of the outer pogo tower may comprises two or more springy pins which be preferably set at unequal angle to prevent miss-assembling. Among which, the inner annular surface of the outer pogo tower provides at least one pin receiving hole, at least one of the springy pins comprises a spring and a short pin received in the at least one pin receiving hole, the short pin comprises one end pushed against the spring, and an opposite end exposed outside the inner annular surface. Thus, the short pin of the springy pin is capable of retractility and reposition, and to provide an effectiveness of radial retractable positioning.

Still further, the present invention may further comprises a fixed ring, the outer pogo tower may fixed to the load board of the tester head through the fixed ring, which is used to engage the outer pogo tower on the load board of the tester head. In addition, the outer pogo tower may further comprise a verification card fixed ring disposed on an opposite side of the outer pogo tower away from the load board. The verification card fixed ring is used to fix a verification card on the outer pogo tower, and the verification card is used to verify functions are normal or abnormal before proceeding test.

Furthermore, the present invention may further comprise a probe card optionally received in the recessed card holder of the base. The probe card may include a plurality of outer annular contacts and a plurality of inner annular contacts. Among which, the plurality of annular outer contacts are electrically contacted to the outer pogo pins of the outer pogo tower correspondingly. On the other hand, the plurality of inner annular contacts are electrically contacted to the inner pogo pins of the inner pogo tower correspondingly. Moreover, the present invention may further comprise a small size probe card optionally received in the recessed card holder of the base. The small size probe card may include a plurality of annular contacts, which are electrically contacted to the inner pogo pins of the inner pogo tower correspondingly.

Consequently, the semiconductor test equipment of the present invention is capable of using two or more different sizes of probe cards for testing but without to disassemble the load board or to modify any other hardware inside the equipment, and to reach an objective of changing specifications rapidly and also to reduce costs of converting process for enhancing the utilization ratio of the semiconductor test equipment.

Other objects, advantages, and novel features of the present invention will become more apparent from the following detailed descriptions when taken in conjunction with the accompanying drawings.

DETAILED DESCRIPTION OF THE PREFERRED EMBODIMENTS

Figure 1:
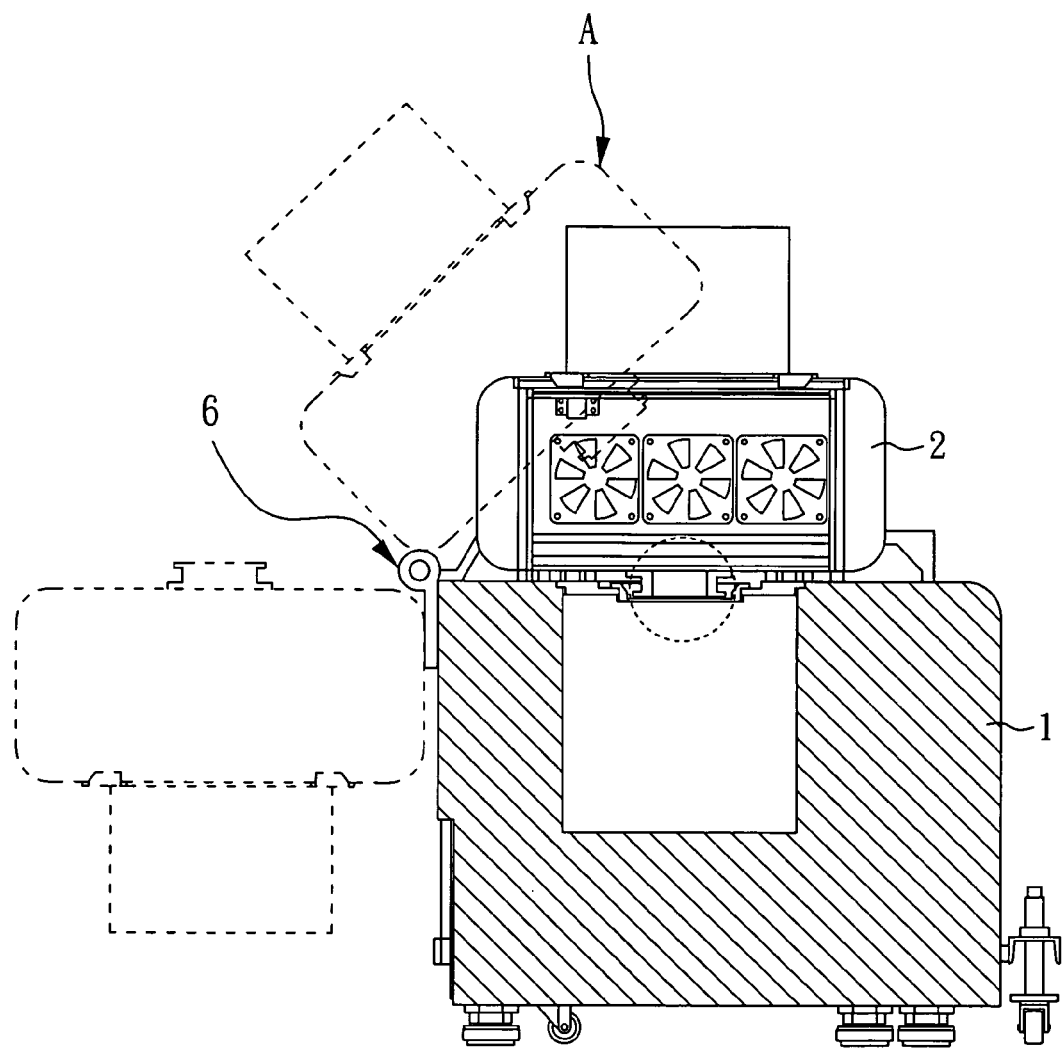
FIG. 1 is a schematic diagram showing a semiconductor test equipment as a whole according to a first preferred embodiment of the invention.
Figure 2:
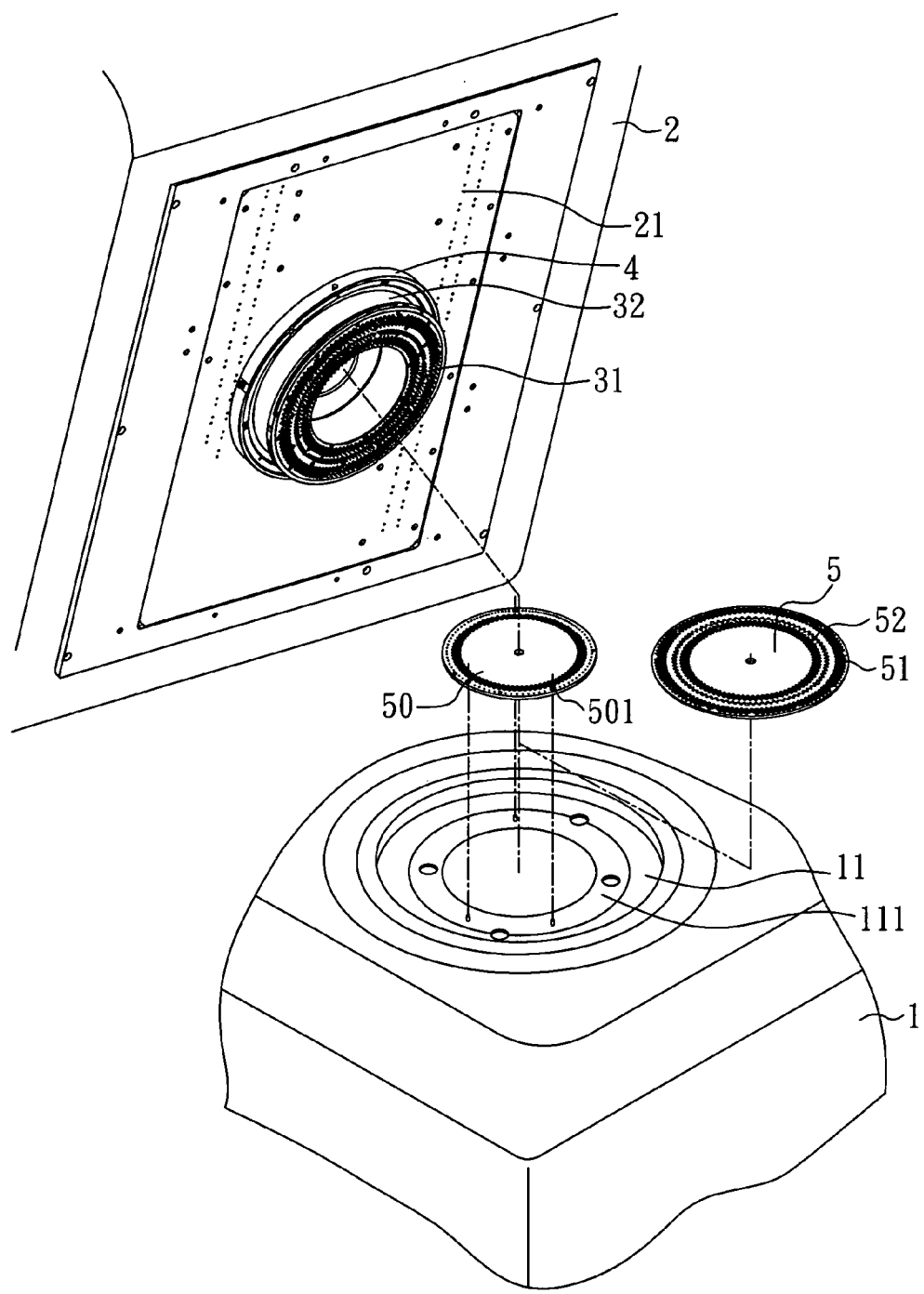
FIG. 2 is a perspective view showing a tester head, being located in position a, according to a first preferred embodiment of the invention.

Please referring to FIG. 1 together with FIG. 2, FIG. 1 is a schematic diagram showing a semiconductor test equipment as a whole according to a first preferred embodiment of the present invention; and FIG. 2 is a perspective view showing a tester head, being located in position a, according to a first preferred embodiment of the invention. As shown in the figures, a base 1 includes a stage 11 thereon, and a recessed card holder 111 is provided on the stage 11 which is used to place a probe card 5, a small size probe card 50, a wafer to be tested, or other semiconductor chips or electronic components to be tested. In addition, the figures show a tester head 2 which may rotate closer to or away from the stage 11 of the base 1 through a rotating arm 6. The tester head 2 is separably disposed on the stage 11 of the base 1, a load board 21 that comprises circuits and contacts is provided below the tester head 2.

Figure 3:
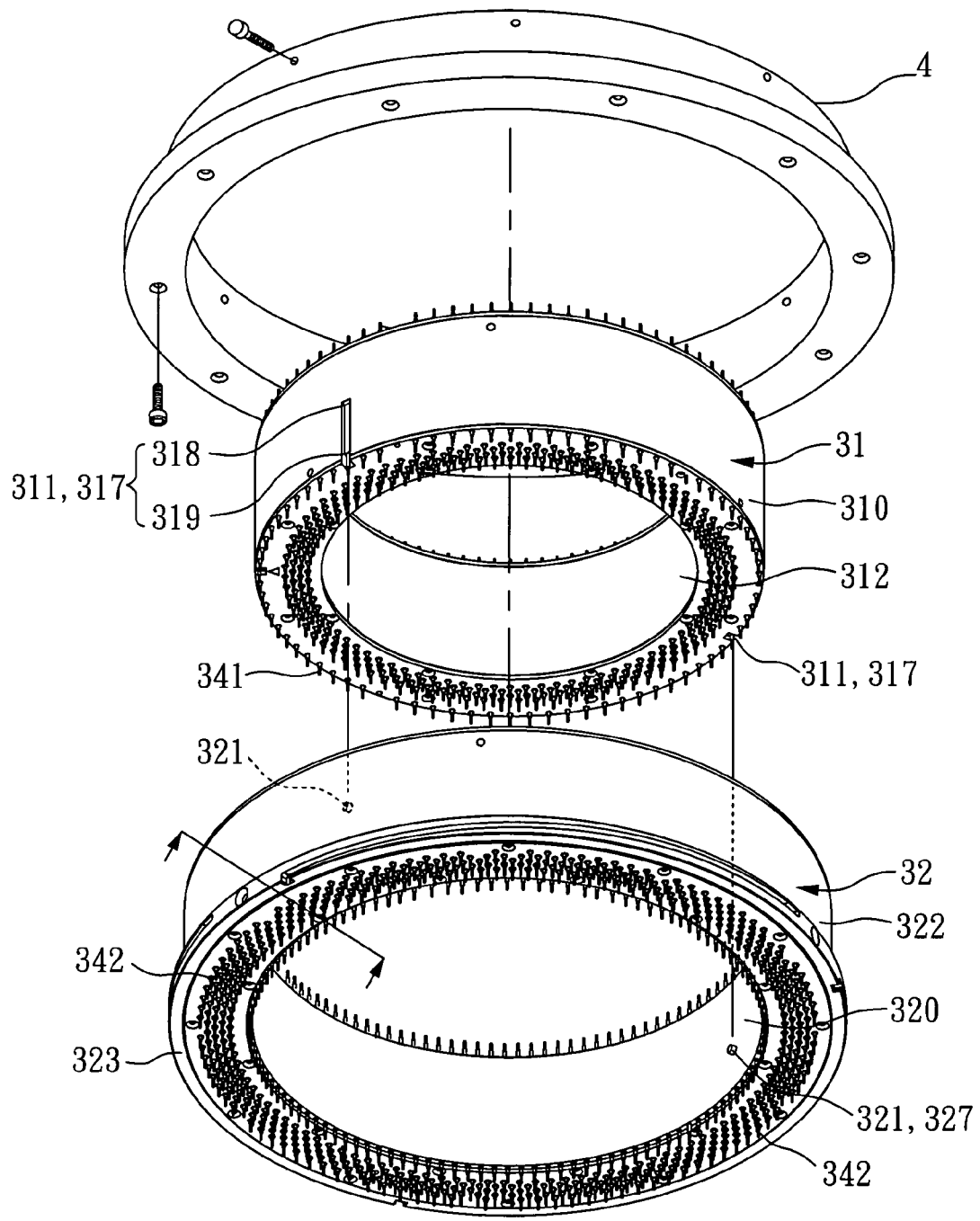
FIG. 3 is an exploded view diagram showing an inner pogo tower and an outer pogo tower, according to a first preferred embodiment of the invention.

Further referring to FIG. 3, FIG. 3 is an exploded view diagram showing an inner pogo tower and an outer pogo tower, according to a first preferred embodiment of the invention. As shown in the figures, an outer pogo tower 32 includes an inner annular surface 320, a first connecting component 321, a plurality of outer pogo pins 342, a fixed ring 4, and a verification card fixed ring 323. In the present embodiment, the first connecting component 321 of the outer pogo tower 32 includes two connecting pins radially protruded from the inner annular surface 320 of the outer pogo tower. The fixed ring 4 is used to engage the outer pogo tower 32 on the load board 21 of the tester head 2. The verification card fixed ring 323 disposed on an opposite side of the outer pogo tower 32 away from the load board 21, the verification card is used to verify functions is normal or abnormal before proceed test.

Moreover, the figures also show an inner pogo tower 31 includes an outer peripheral surface 310. The inner pogo tower 31 is concentrically received in the outer pogo tower 32 and surrounding with the inner annular surface 320 of the outer pogo tower 31. The inner pogo tower 31 includes an outer peripheral surface 310, a second connecting component 311 and a plurality of inner pogo pins 341. In the present embodiment, the second connecting component 311 includes two connecting slot 317 recessed on the outer peripheral surface 310. Each of connecting slots 317 comprises an opened end 319 and a closed end 318; the opened end 319 is configured faraway from the load board 21 rather than the closed end 318. Accordingly, the inner pogo tower 31 integrates with the outer pogo tower 32 through the second connecting component 311 correspondingly engaging with the first connecting component 321. Moreover, the outer pogo tower 32 is fixed to the load board 21 of the tester head 2 together with the inner pogo tower 31 corresponding to the recessed card holder 111 of the base 1. Hence, the plurality of inner pogo pins 341 and the plurality of outer pogo pins 342 are electrically connected to the load board 21 respectively.

Furthermore, the two connecting radial pins 327 of the outer pogo tower 32 correspondingly sliding into the opened end 319 of the two connecting slots 317 and stopped at the closed end 318 for engagement, which to reach the purposes of assembling, engaging, and fixing detachably. Besides, as well as the first connecting component 321 and the second connecting component 311 aforementioned can be exchanged, or utilize the way of embedding, lodging, fastening, locking, or other equivalents.

Figure 4:
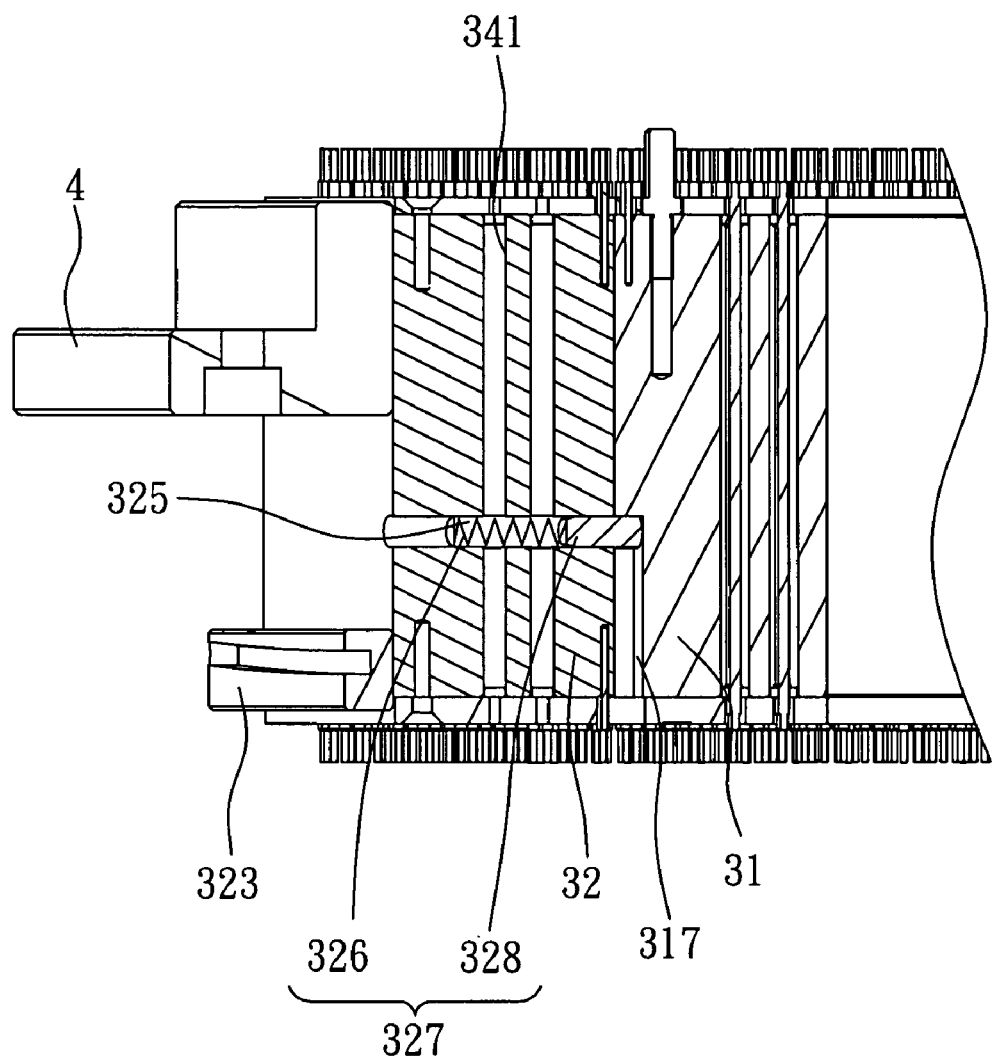
FIG. 4 is a cross-sectional view showing part of an inner pogo tower and an outer pogo tower in an enlarged scale according to a first preferred embodiment of the invention.

Please referring to FIG. 4 simultaneously, FIG. 4 is a cross-sectional view showing part of an inner pogo tower and an outer pogo tower in an enlarged scale according to a first preferred embodiment of the invention. As shown in the figures, the connecting slots 317 of the second connecting components 311 of the present embodiment are axially extended slots, also it is able to be replaced for L-shaped slot, spiral slot, or any other form of slot. In addition, the connecting pins 327 of the first connecting components 321 are springy pins which be preferably set at unequal angle to prevent miss-assembling. Among which, the connecting pins 327 of the present embodiment are constructed of the following manner. The inner annular surface 320 of the outer pogo tower 32 provides two pin receiving holes 325, the connecting pins 327 comprises a spring 326 and a short pin 328 which are received in the pin receiving holes 325. The short pin 328 comprises one end pushed against the spring 326; and an opposite end exposed outside the inner annular surface 320. Thus, the short pins 328 of the connecting pins 327 are capable of retractility and reposition, and to provide an effectiveness of radial retractable positioning, and more convenient to assemble or disassemble.

Please referring to FIG. 2, the figure shows a probe card 5, and a small size probe card 50. The main intention is to change two or more different sizes of probe cards for testing in any time without disassembling the load board 21 or modifying any hardware inside of the equipment, so that may reach an objective for changing specifications rapidly and may also reduce the costs of converting process for enhancing the utilization ratio of the semiconductor test equipment. In detail, for the present embodiment, it may select small size probe card 50 when only need to test specifications for the 256 input/output channels and 16 groups DPS. On the other hand, it may select small size probe card 5 when need to test specifications for the 512 input/output channels and 32 groups DPS.

In other words, the probe card 5 is received optionally in the recessed card holder 111 of the base 1. The probe card 5 may include a plurality of outer annular contacts 51 and a plurality of inner annular contacts 52. Among which, the plurality of outer annular contacts 51 are electrically contacted to the outer pogo pins 342 of the outer pogo tower 32 of the tester head 2 correspondingly. Besides, the plurality of inner annular contacts 52 are electrically contacted to the inner pogo pins 341 of the inner pogo tower 31 of the tester head 2 correspondingly. On the other hand, because of the small size probe card 50 relatively includes fewer channels required for the test, it only includes a plurality of annular contacts, which are electrically contacted to the inner pogo pins of the inner pogo tower correspondingly.

Figure 5:
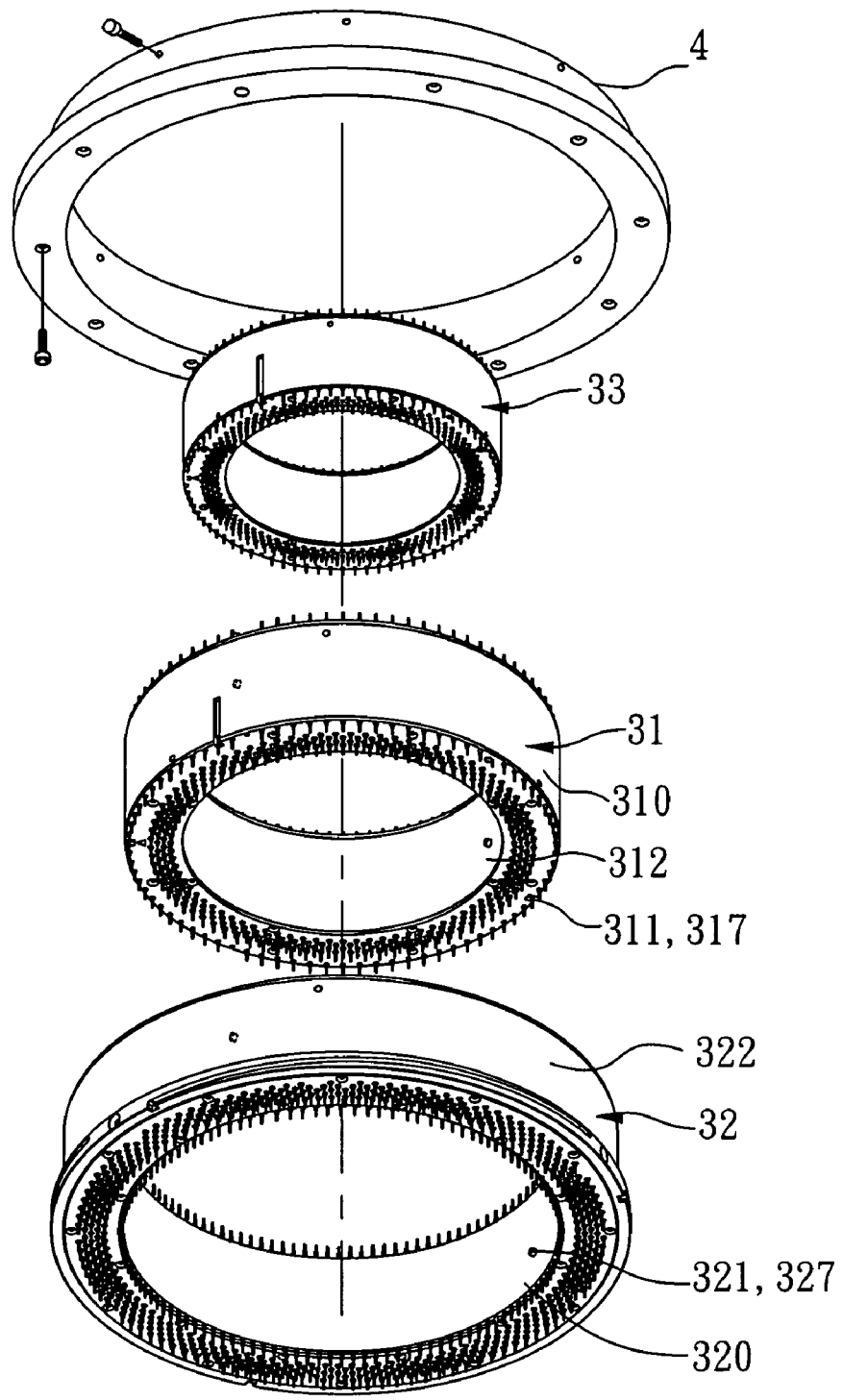
FIG. 5 is an exploded view diagram showing a pogo tower, according to a second preferred embodiment of the invention.

Please referring to FIG. 5, FIG. 5 is an exploded view diagram showing a pogo tower, according to a second preferred embodiment of the invention. The present embodiment is to illustrate the extensibility of the present invention. In detail, except for that the inner pogo tower 31 integrates with the outer pogo tower 32 through the second connecting component 311 correspondingly engaging with the first connecting component 321 aforementioned, it further attaches an expanding pogo tower 33. The expanding pogo tower 33 is assembled in an inner annular surface 312 of the inner pogo tower 31 by the same way to expand the test specifications. Of course, ways of expanding are not limited to the way aforementioned, another approach could be attached to the outer peripheral surface 322 of the outer pogo tower 32.

Although the present invention has been explained in relation to its preferred embodiments, it is to be understood that many other possible modifications and variations can be made without departing from the scope of the invention as hereinafter claimed.

What is claimed is:

1. A semiconductor test equipment with concentric pogo towers, comprising:
   a base, including a stage thereon, and a recessed card holder provided on the stage;
   a tester head, being removeably provided on the stage of the base, the tester head including a load board therebelow;
   an outer pogo tower, including an inner annular surface, a first connecting component and a plurality of outer pogo pins; and
   an inner pogo tower, being concentrically received in the outer pogo tower and surrounding with the inner annular surface of the outer pogo tower, the inner pogo tower including an outer peripheral surface, a second connecting component and a plurality of inner pogo pins;
   wherein, the inner pogo tower integrating with the outer pogo tower through the second connecting component correspondingly engaging with the first connecting component; the outer pogo tower being fixed to the load board of the tester head together with the inner pogo tower corresponding to the recessed card holder of the base, in which the plurality of inner pogo pins and the plurality of outer pogo pins being electrically connected to the load board respectively; and
   wherein the second connecting component of the inner pogo tower includes at least one connecting slot recessed on the outer peripheral surface thereof, the at least one connecting slot comprises an opened end and a closed end, the opened end being configured faraway from the load board rather than the closed end; the first connecting component of the outer pogo tower including at least one connecting pin radially protruded from the inner annular surface of the outer pogo tower; the at least one connecting pin correspondingly sliding into the opened end of the at least one connecting slot and stopped at the closed end for engagement.

2. The semiconductor test equipment with concentric pogo towers as claimed in claim 1, wherein the first connecting component of the outer pogo tower is detachably engaged with the second connecting component of the inner pogo tower.

3. The semiconductor test equipment with concentric pogo towers as claimed in claim 1, wherein the at least one connecting slot of the inner pogo tower comprises two or more axially extended slots.

4. The semiconductor test equipment with concentric pogo towers as claimed in claim 1, wherein the at least one connecting pin of the outer pogo tower comprises two or more springy pins.

5. The semiconductor test equipment with concentric pogo towers as claimed in claim 4, wherein the inner annular surface of the outer pogo tower provides at least one pin receiving hole; at least one of the springy pins comprising a spring and a short pin received in the at least one pin receiving hole, the short pin comprising one end pushed against the spring, and an opposite end exposed outside the inner annular surface.

6. The semiconductor test equipment with concentric pogo towers as claimed in claim 1, wherein the outer pogo tower further comprises a fixed ring, the outer pogo tower being fixed to the load board of the tester head through the fixed ring.

7. The semiconductor test equipment with concentric pogo towers as claimed in claim 1, wherein the outer pogo tower further comprises a verification card fixed ring disposed on an opposite side of the outer pogo tower away from the load board.

8. The semiconductor test equipment with concentric pogo towers as claimed in claim 1, further comprises a probe card received in the recessed card, holder of the base, the probe card including a plurality of outer annular contacts and a plurality of inner annular contacts; the plurality of outer annular contacts being electrically contacted to the outer pogo pins of the outer pogo tower correspondingly; the plurality of inner annular contacts being electrically contacted to the inner pogo pins of the inner pogo tower correspondingly.

9. The semiconductor test equipment with concentric pogo towers as claimed in claim 1, further comprises a small size probe card received in the recessed card holder of the base, the small size probe card including a plurality of annular contacts, the plurality of annular contacts being electrically contacted to the inner pogo pins of the inner pogo tower correspondingly.

* * * * *